United States Patent [19]

Lopez

[11] Patent Number: 5,111,208
[45] Date of Patent: May 5, 1992

[54] CALIBRATION OF PLURAL - CHANNEL SYSTEM

[75] Inventor: A. R. Lopez, Commack, N.Y.
[73] Assignee: Hazeltine Corporation, Greenlawn, N.Y.
[21] Appl. No.: 314,336
[22] Filed: Feb. 23, 1989
[51] Int. Cl.$^5$ .............................................. G01S 7/40
[52] U.S. Cl. ..................... 342/174; 342/377
[58] Field of Search ............... 342/174, 165, 173, 368, 342/371, 372, 377

[56] References Cited

U.S. PATENT DOCUMENTS

| | | | |
|---|---|---|---|
| 3,727,223 | 4/1973 | O'Meara | 342/82 X |
| 4,104,637 | 8/1978 | Nielson | 342/401 |
| 4,176,354 | 11/1979 | Hsiao et al. | 342/173 |
| 4,517,570 | 5/1985 | Gray, Jr. | 342/372 |
| 4,520,361 | 5/1985 | Frazita | 342/372 |
| 4,532,517 | 7/1985 | LaBerge et al. | 342/372 |
| 4,538,150 | 8/1985 | Bone, Jr. | 342/174 |
| 4,639,732 | 1/1987 | Acoraci et al. | 342/371 |
| 4,673,939 | 6/1987 | Forrest | 342/174 |
| 4,724,440 | 2/1988 | Lopez et al. | 342/368 |

Primary Examiner—John B. Sotomayor
Attorney, Agent, or Firm—E. A. Onders

[57] ABSTRACT

In a system having plural signal-carrying channels, a phase shift is introduced between a signal in one of the channels and a reference signal for calibrating the individual channels. The reference signal is obtained by adding samples of signals in other ones of the channels. The phase shift is introduced by phase-shift apparatus responsive to a command signal directing a continuous monotonic increment of phase. The phase incrementing introduces a frequency shift (a serrodyne), which produces a beat-frequency signal for mixing a channel signal with the reference signal. The beat-frequency signal is phase locked to a modulation patern of a command signal, whereby a measurement of phase (or delay) can be made between the two signals for calibration of each channel within the system. Separate calibrations may be made for different presumed values of system delay so as to obtain a value of system delay which causes the calibration sequence to converge to fixed values of phase shift introduced in each of the channels.

12 Claims, 8 Drawing Sheets

ROTATE #1

FIG. 8B

ROTATE #3

FIG. 8D

ROTATE #2

FIG. 8C

| FILT. DELAY (MICROSECONDS) | PHASE SHIFT ERROR (DEG.) | NUMBER OF PHASORS CHANGE STATE |
|---|---|---|
| 0 | 11.25 | 13 |
| 1 | 8.44 | 8 |
| 2 | 5.63 | 1 |
| 3 | 2.81 | 0 |
| 4 | 0 | 0 |
| 5 | 2.81 | 0 |
| 6 | 5.63 | 1 |
| 7 | 8.44 | 4 |
| 8 | 11.25 | 8 |

STABILIZATION SEQUENCE

CALIBRATION OF PLURAL - CHANNEL SYSTEM

BACKGROUND OF THE INVENTION

This invention relates to a system having plural signal-carrying channels, such as a scanning array antenna, and more particularly, to a method and an apparatus for fault testing components of the system, as well as for measuring and adjusting starting phases of an array antenna prior to a scan in order to form a focused beam.

Plural channel systems are often constructed with numerous signal-carrying channels arranged in parallel. Examples of such systems are found in electrical communication, including telemetry where different messages are transmitted along parallel channels, apparatus for sound amplification and recording, where a signal is divided among separate spectral passbands for correction of a loudness characteristic, and array antennas, where multiple channels provide various time delays and/or phase shifts for steering a beam of radiation.

In any of the foregoing plural-channel systems, optimum operation of the system is obtained when the design characteristics of the respective channels are maintained. Such characteristics may include preset time delays, preset phase shifts, and preset amplification factors for signals propagating through the channels. A calibration process and equipment are utilized to provide optimum operation.

One area of considerable interest occurs in a microwave landing system (MLS) used for guiding aircraft to a landing on an airport runway. An array antenna is advantageously employed in an MLS for forming a glide slope beam or a localizer beam. The direction and the pattern of the beam are dependent on the phase shifts (and possibly on amplitude shading factors) applied to radiators of the array of individual signal-carrying channels coupled to respective ones of the radiators. MLS phase calibration is employed to measure the insertion phase of each channel of an MLS array. The calibration information is used to adjust the starting phase of each element in the array to compensate for the insertion phase errors resulting from manufacturing processes, tolerances, and component aging. Proper MLS phase calibration results in a well-focused beam with low side lobes and should be performed periodically to correct aging effects. It is advantageous if such calibration could be accomplished automatically, and at sufficiently frequent intervals, so as to correct for any differential phase shifts induced among channels of the system due to thermal expansion, which expansion may occur, by way of example, in a phased array antenna located at an airport runway and illuminated directly by rays of the sun. Calibration of the array antenna is important to ensure that the beam is properly formed and correctly directed for a safe landing by the aircraft.

A problem arises in that the calibration of the foregoing systems has entailed overly complex equipment and time-consuming processes. For example, in the case of a phased array antenna, such processes have employed the injection of testing signals followed by the measurement of in-phase and quadrature components utilizing complex algorithms in computers. This problem is due, in part, to the difficulty of measuring one channel without being "swamped" by all other channels in the array. An attempt to solve this problem by automatically calibrating a system having plural-signal carrying channels is disclosed in U.S. Pat. No. 4,520,361 issued in the name of R. F. Frazita on May 28, 1985, and assigned to Hazeltine Corporation, the assignee herein. In the Frazita patent, a waveguide manifold is employed for extracting microwave signal samples from each of a plurality of radiators of an array antenna, which samples are compared to a reference signal. A continuously incremented phase shift as introduced between a channel under test and the reference signal for a serrodyning of one signal relative to the other signal with a consequent frequency shift between the two signals. Upon mixing the two signals, a beat frequency signal is obtained wherein the phase shift is dependent on component parameters such as insertion phase shift and delay. By measuring the delay in the beat frequency signal relative to a phase shift pattern employed in the serrodyning, a proper value of compensatory phase shift is determined and is inserted as a preset value of phase shift in the channel under test. The procedure is repeated for each of the channels so that differential phase shift can be minimized for improved formation of a transmitted beam of radiation. While the system of the Frazita patent functions properly, it does not solve the foregoing problem completely because the system of the Frazita patent provides the reference signal by means of an additional signal channel, which itself may introduce error in the calibration of the other channels.

It is, therefore, an object of the present invention to provide a new and improved apparatus and method for calibrating a system having a plural signal-carrying channels.

While the invention is ideally suited for use in calibrating numerous types of systems, the invention will be described in the context of calibration apparatus for use with a phased-array antenna of the type used in a microwave landing system (MLS). The physical structures of the components utilized in construction of the invention are such as to permit their coupling to the phased-array antenna with a minimal addition to the complexities of the structure of the antenna itself. Also, electronic circuitry of the invention is operated readily in conjunction with circuitry which operates the MLS.

Individual radiators of the antenna are energized by separate signal-carrying channels, each of which includes a phase shifter, the phase shifters being coupled, in turn, via a power divider to a common transmitter. The phase shifters are individually actuated by command signals supplied by a beam-steering unit wherein individual phase shifts are applied to the signals energizing the respective radiators for shaping and directing a resulting beam of radiation provided by the array of radiators.

SUMMARY OF THE INVENTION

In accordance with the invention there is provided apparatus which includes means for extracting a signal sample from each channel of a plural-channel signal carrying system, and summing the signal samples to provide a reference signal. Individual ones of the channels are selected, one at a time, for calibration against the reference signal, the reference signal being a composite of the signals of all of the other channels. In the selected channel, the phase shifter is operated to continuously impart incremental phase shifts. The continuously incremented phase shift results in a frequency offset between the selected channel signal and the reference signal. Such a frequency offsetting by means of phase incrementing is referred to as "serrodyning." The phase is incremented in accordance with a preset pattern of phase shifts, which may be referred to as a serrodyne phase pattern.

In accordance with another aspect of the invention, the extraction of the signal samples from the respective channels is accomplished by use of a waveguide manifold which is coupled to each of the radiators of an MLS array antenna. An output port of the manifold carries a composite signal consisting of the reference signal and the serrodyne signal of the selected channel. The two components of the composite signal are applied to a nonlinear electric circuit, such as a diode bridge circuit, to provide a mixing of the serrodyned signal with the reference signal. Since the serrodyned signal has a frequency offset from that of the reference frequency, the mixing of the two signals produces a beat-frequency signal. By way of example of the signal frequencies employed in the preferred embodiment of the invention, the beat-frequency signal is 7.8125 KHz (kilohertz), while the frequency of the reference signal is approximately 5 GHz (gigahertz) with a wavelength of approximately 2.25 inches The invention synchronizes the phase shift imparted to the signal of the selected channel with the test pattern of the phase increments. The pattern of phase increments is provided by a command signal applied to the phase shifter of the selected channel. In the beat signal, the zero crossings are synchronized with the serrodyne phase pattern. The time of a zero crossing in the beat signal is measured to determine the value of insertion phase shift, as well as the shift resulting from signal delays within components of the system, including delays resulting from thermal expansion of system components. The fixed value of phase shift, for compensating for the measured phase shift in the beat signal, is then applied to the phase shifter of the selected channel, thereby to calibrate the selected channel. The procedure is then repeated for a second, a third and other ones of the signal channels until all of the signal channels have been calibrated.

The phase shifter employed in each channel of the preferred embodiment of the invention is a digital phase shifter wherein changes in phase can be accomplished only as multiples of a fixed minimum phase increment. The reference signal may be viewed as a sum of many signals having the same frequency but described by vectors pointing in numerous directions, the direction of the vector being the phase of an individual signal. All phases are measured modulo 360°. With each repetition of the calibration process for calibrating a subsequent one of the signal channels, there is a change in the reference signal. The change is caused by a removal of one of the component signal vectors, and the altering of the phase of another of the signal vectors. The removal of a signal vector occurs upon the shifting of the signal frequency of the selected channel because the system response time is such that only those channel signals of equal frequency cooperate in producing the reference signal. The alteration of the phase angle of a signal vector occurs whenever a phase shifter of a previously selected channel is preset with a fixed compensating value of a phase shift. As a result, it is apparent that the reference signal changes during a calibration run of all of the channels. Accordingly, it is necessary to repeat the calibration run one or more times to ensure that the channels are properly calibrated.

An important feature of the invention is the recognition that the alteration of the reference signal, and the implementation of the quantized values of phase shift must be accomplished in a manner which insures stability of the calibration process. Stability is accomplished by a convergence of the compensation phase shift values to constant values of compensation during successive calibration runs. Instability is manifested by a failure of the calibration values to assume a desired fixed set of values with subsequent calibration runs. It has been determined that, in the mixing operation, the use of a bandpass filter to extract the beat-frequency signal introduces a delay to the calibration process, which delay can be source of system instability. The filter delay is compensated by a stabilization procedure. In the stabilization procedure, a reference point in time, against which a zero crossing of the beat signal is measured, is advanced and retarded within a range of values approximating the filter delay. A stable calibration sequence has zero changes in phasor settings between successive calibration runs. The stable sequence occurs upon compensation for the filter delay, and shows stable operation of the calibration process.

For a better understanding of the present invention, together with other and further objects, reference is made to the following description, taken in conjunction with the accompanying drawings, and the scope of the invention is set forth in the appended claims.

BRIEF DESCRIPTION OF THE DRAWINGS

FIG. 8 consists of four parts, identified as FIGS. 8A–8D, which show various stages of vectorial construction in which a set of three vectors are rotated individually and successively to attain substantial equality of phase shift among the three vectors, thereby to demonstrate the calibration process of the invention wherein the phase shifts of the respective signal channels are equalized;

DESCRIPTION OF THE INVENTION

Figure 1:
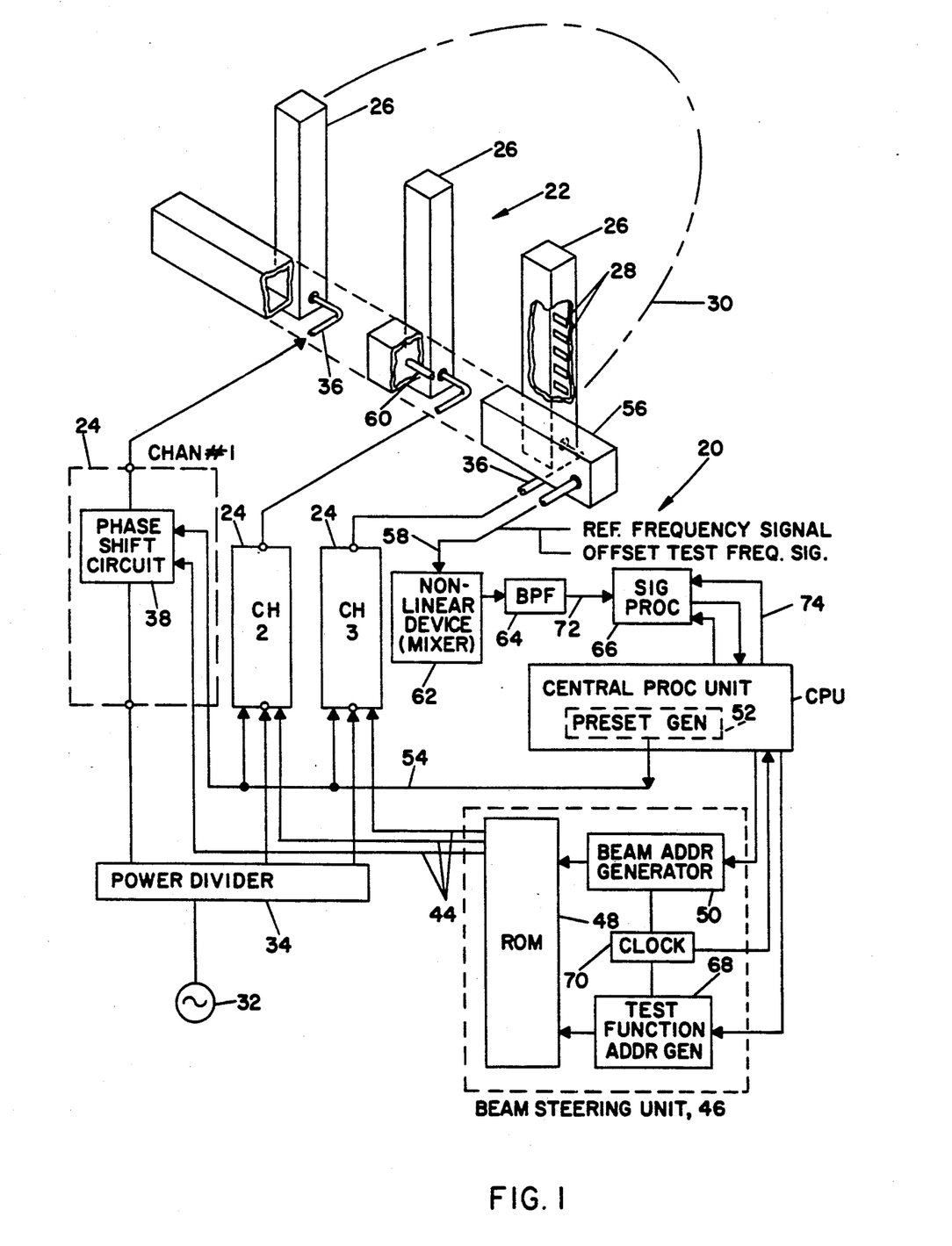
FIG. 1 illustrates a phased-array antenna for an MLS, coupled to a multiple-channel phase-shifter circuit including circuitry of the invention, the view being partially stylized and partially in block diagram form.

FIG. 1, there is shows a portion of a microwave landing system (MLS) 20 comprising a phased-array antenna 22 and a set of signal-carrying channels 24 for applying signals to the individual radiators 26 of antenna 22. While antenna 22 may comprise many radiators 26, only three are shown in FIG. 1 to simplify the drawing. Each of the radiators 26 is of a slotted waveguide, exemplary slots 28 being shown in a cutaway portion of one of the radiators 26. The set of radiators 26, when energized with their respective signals from the corresponding channels 24, develop a beam 30 suitable for the guidance of aircraft (not shown).

Channels 24 are fed a signal supplied by a generator 32 and coupled to the input terminals of channels 24 via a power divider 34. The output terminals of channels 24 are coupled by a coaxial cables 36 to respective ones of the radiators. Each of the channels 24 comprises a phase-shifting circuit 38 controlled by a signal from beam-steering unit 46 provided via leads 44.

The beam-steering unit 46 illustrated in block-diagram form in FIG. 1 is of conventional design and includes a read-only memory (ROM) 48 and an address generator 50 which addresses ROM 48 to provide an appropriate set of increment command signals on the lines 44 for establishing specific positions of the beam 30, as well as a scanning of the beam. Included in system 20 is a central processing unit (CPU) having a preset generator 52 which outputs preset signals via a data bus 54 to the phase shift circuit 38 in each of the channels 24. An initial specific direction of the beam 30 is established by preset command signals supplied to the phase shifters 38 via the bus 54. Together, the command signals on line 44 and the preset signals on bus 54 control the phase-shift circuits 38 in channels 24 for imparting selected phase-shifts to the signals from source 32, thereby to position beam 30 in a specific direction and to scan the beam in fixed time sequence and pattern. If desired, channels 24 may include circuitry (not shown) such as amplifiers and gain-control circuits to provide an amplitude shading to the signals applied via the cables 36 to the respective radiators 26 for further definition of the pattern of beam 30.

In accordance with the invention, system 20 further comprises a waveguide manifold 56 which is coupled to each of the radiators 26 for extracting samples of the output signals of the respective channels 24. These output samples appear on lead 58. Manifold 56 is coupled to the back sides of the respective radiators 26, opposite the front sides which contain slots 28. The coupling of the manifold 56 to the radiators 26 is accomplished by apertures 60, one such aperture 60 being shown in a cut-away portion of manifold 56. Suitable Construction for manifold 56 is disclosed in U.S. Pat. No. 4,554,550 issued in the name of Alfred R. Lopez for RESONANT WAVEGUIDE APERTURE MANIFOLD, and U.S. patent application Ser. No. 497,350 of Richard F. Frazita for ASYMMETRIC RESONANT WAVEGUIDE APERTURE MANIFOLD both of which are assigned HAZELTINE CORPORATION, the assignee herein, and the disclosures of which are incorporated herein by reference. The amount of power coupled by apertures 60 to the manifold output on lead 58 is a small fraction of the power transmitted by the respective radiator 26, less than 30 dB (decibels), so as to minimize any effect on the radiation of electromagnetic energy from antenna 22.

The invention further includes a nonlinear device 62 which functions as a mixer for signal components of differing frequencies outputted from manifold 56 on lead 58. Also included is a band-pass filter 64, a signal processor 66, and an address generator 68, the latter providing test function addresses to the ROM 48. A clock 70 drives both address generators 50 and 68 as well as the CPU. Operation of mixer 62 results in the production of a beat-frequency signal, equal to the difference in frequency between two signal components on lead 58, namely, a reference frequency signal and an offset test frequency signal as will be described hereinafter. The beat-frequency signal is separated from the remainder of the mixer output by band-pass filter 64.

Filter 64 applies the beat-frequency signal via lead 72 to a signal processor 66. As will be explained in further detail subsequently, generator 68 addresses the ROM 48 to provide a predetermined pattern of phase-shift commands for serrodyning respective ones of the phase-shift circuits 38, resulting in the appearance of beat-frequency signals at the output of filter 64. A time reference signal, indicating the beginning of the reference phase command pattern employed in the serrodyning, is applied by the CPU via lead 74 to signal processor 66. The timing signal on lead 74 in conjunction with the beat-frequency signal on lead 72 allow the signal processor 66 to accomplish a measurement of time delay between a zero-crossing of the beat-frequency signal and the timing signal on line 74. This time delay measurement is employed for determining of phase shift between a test signal outputted by the serrodyning of a signal in a channel 24 relative to a reference signal produced within the manifold 56.

Figure 2:
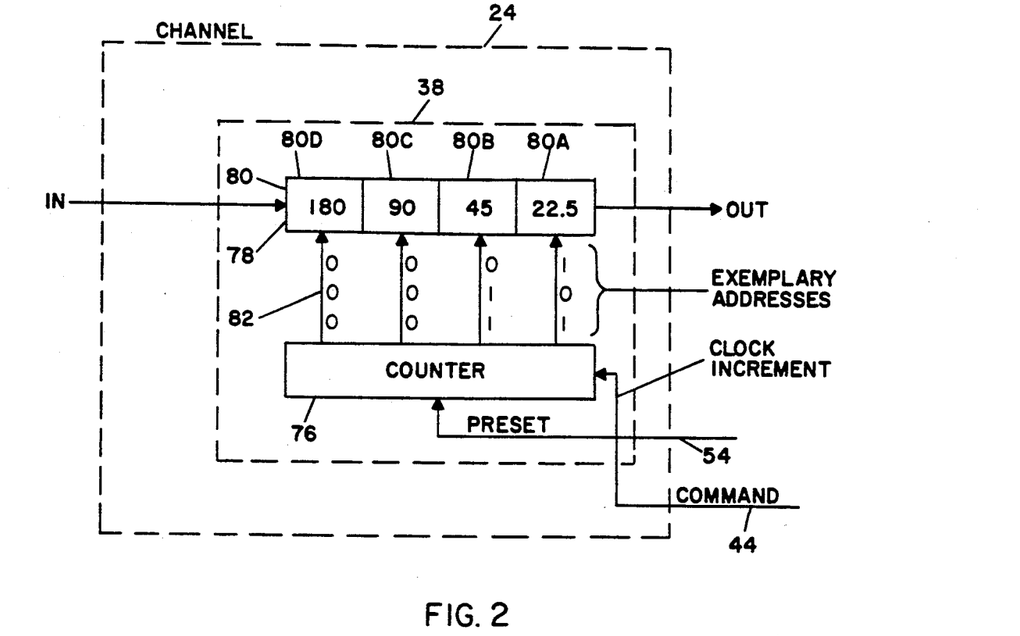
FIG. 2 is a block diagram of a phase shifter assembly of one of the channels of FIG. 1.

FIG. 2 provides a more detailed view of a channel 24 and the phase-shifting circuit 38 therein. The phase-shifting circuit 38 includes a counter 76 and an assembly 78 of phase shifters 80A–80D. Phase shifters 80 are connected in series and are addressed by a corresponding one of the output lines of counter 76. Each phase shifter 80 may be of the well-known diode type. By way of example, such a diode phase shifter would comprise a set of stub tuned transmission lines which are shorted upon activation of diodes, thereby changing the electrical lengths of the stub transmission lines. Thus, there are two phase-shifter states; namely, zero phase shift, when the diodes are degenerized, and a fixed phase shift, such as 45°, upon energization of the diodes.

Each of the phase shifters 80 operates independently of the other phase shifters in the assembly 78 and is responsive to an output signal from a corresponding stage of counter 76. Thus, each phase shifter 80 can produce a phase increment independently of the phase increment produced by another of the phase shifters, which increments are additive to provide a total phase shift for the assembly 78. The phase shifters 80A–80D provide phase shifts and increments of, respectively, 22.5°, 45°, 90°, and 180°. By way of example, a phase shift of 135° is obtained by activating phase shifters 80B (45°) and 80C (90°) while the phase shifters 80A and 80D are deactivated. The signals outputted by the stages of the counter 76 to the phase shifters 80 are digital signals having a relatively high value (logic-1) for activating a phase shifter 80, or a relatively low value (logic-0) for deactivating a phase shifter. The composite output of the four stages of the counter 76 represents a digital word designating a total amount of phase shift. Exemplary output counts of the counter 76, in digital format, are shown adjacent the leads 82 interconnecting the output stages of the counter 76 with the phase shifters 80. Individual digits of the count serve as addresses to the phase shifters 80.

In accordance with a feature of the invention, the foregoing connection of the output leads 82 of counter 76 to the respective phase shifters 80 facilitates both serrodyning in the calibration mode of the system 20, as well as selection of the proper phase for directing beam 30 during use of the antenna 22 for guiding aircraft. A command signal on one of the leads 44 consists of clock pulse signals that are applied to the counter 76 for implementing a count of the counter. Prior to incrementing the count, counter 76 is preset with a count supplied via bus 54 from the preset generator 52 (FIG. 1). In the operation of the phase-shifting circuit 38 for forming the beam 30, counter 76 is accessed by generator 52 to establish an initial value, after which the clock pulses are applied to advance the counter 76 to address the requisite amount of phase shift from the assembly 78 of phase shifters 80. It should be understood that portrayal of the assembly 78 in FIG. 2 as consisting of four phase shifters 80 is by way of example, and that other quantities of phase shifters may be employed in assembly 78. With the four-stage counter 76 shown in FIG. 2, during an incrementing of counter 76 with clock pulses of the command signal on lead 44, counter 76 recycles after reaching a count of 16.

By use of the calibration mode of the invention, the starting phase of the array is measured and adjusted so as to form a well-defined beam. This is accomplished by resetting counter 76 to a specific value, after which the scanning of beam 30 is implemented by applying clock pulses, from the command signal on lead 44, to counter 76. The counter counts modulo-16, with the phase shift increasing in increments of 22.25° through 360°, at which point assembly 78 produces a phase shift of zero degrees. The incrementing of phase shift continues modulo 360° during the calibration mode, and during a scanning of the beam, as long as clock pulses are applied to counter 76.

Scanning of the beam is implemented by use of the beam address generator 50, which addresses the ROM 48 to output successive trains of pulses on the leads 44 for updating the phase shift of each circuit 38. The test-function address generator 66 addresses the ROM 48 to increment counter 76 during the calibration mode for directing each circuit 38 to introduce a desired amount of phase shift, and for incrementing phase at a predetermined rate, for serrodyning the signal of a selected channel relative to the reference signal provided by the manifold 56. The CPU applies command signals to the generators 50 and 68 to select channels 24 to be calibrated during a calibration mode, as well as to advance the phase shift for the sweeping of beam 30 during aircraft guidance.

Figure 3:
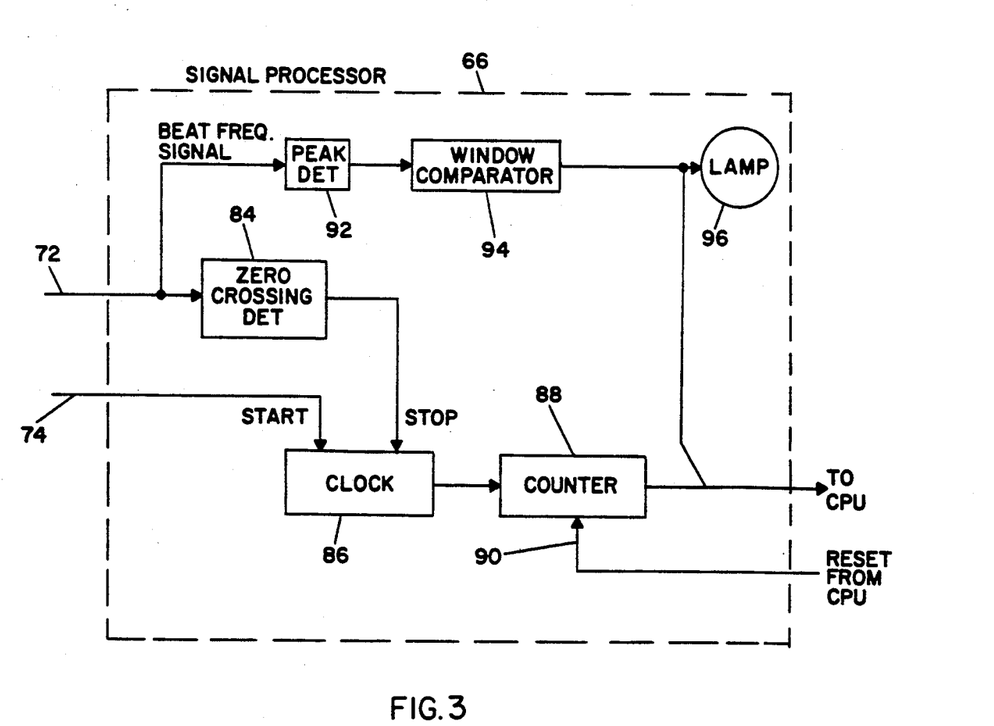
FIG. 3 is a block diagram of the signal processor of FIG. 1.

Referring to FIG. 3, signal processor 66 comprises a zero-crossing detector 84, a clock 86, and a counter 88 with a reset 90, a peak detector 92, a window comparator 94 and an indicator such as a lamp 76. In the presence of serrodyne, the aforementioned frequency shift between an output sample of the test channel signal on lead 58 and the reference signal which also appears on lead 58 results in a beat-frequency signal with a sinusoidal waveform on the lead 72. The sinusoidal signal on lead 72 is applied to the zero-crossing detector 84 which, upon detection of a zero crossing of the sinusoidal signal, produces an output pulse which stops clock 86. Clock 86 is initially started by the timing signal on lead 74 from the CPU. The signal on lead 74 serves as a time or phase reference against which the insertion phase of a channel 24 is to be measured.

Thus, upon the resetting of counter 76 of FIG. 2 by the ROM 48 and the generator 68 under command of the CPU in the calibration mode, the CPU simultaneously sends a time reference signal on lead 74 to start clock 86 in the signal processor 66 of FIG. 3. Counter 88 then counts pulses of the clock 86. The stopping of clock 86 upon the occurrance of the next zero crossing of the signal on lead 72 thereby provides a count on counter 88 which is a measure of the signal propagation delay between the test and the reference signals. The count of counter 88 is applied to the CPU for use in generating a compensatory value of phase shift to be employed in presetting phase-shifter assembly 78 in each of the channels 24.

The signal on lead 72 is also applied to peak detector 92, which measures the maximum amplitude or peak value of the signal on lead 72, and applies a signal to the widow comparator 94 proportional to the amplitude of the beat-frequency signal. Comparator 94 measures the output signal of detector 92 to determine whether or not a signal falls within a specific range of values that is preset within comparator 94. In the event the peak value of the beat-frequency signal falls within the window of comparator 94, the comparator outputs a signal which lights lamp 96 to indicate that the amplitude of the beat-frequency signal on lead 72 is within an acceptable range of values. The signal outputted by comparator 94 is also applied to the CPU.

Figure 4:
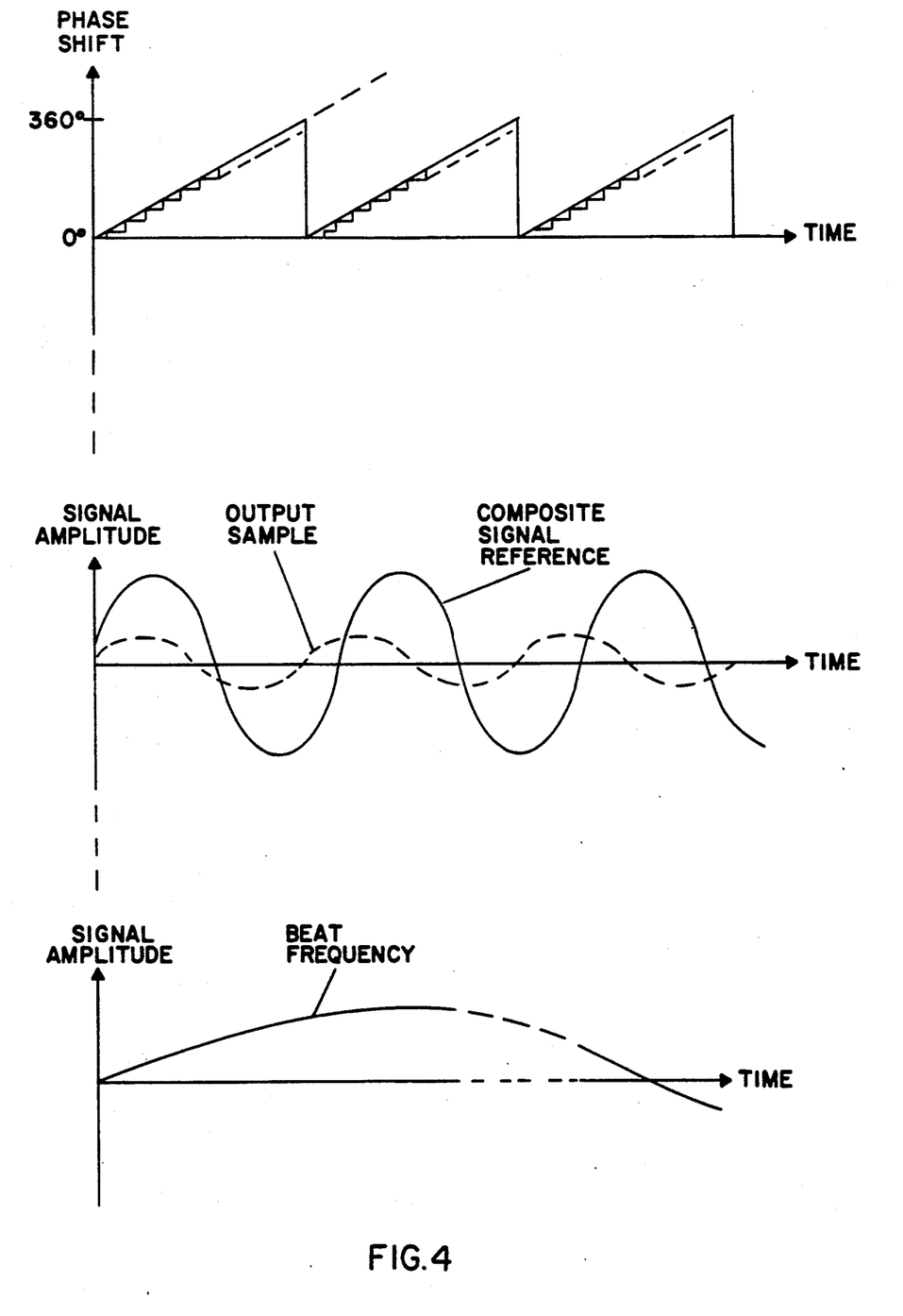
FIG. 4 shows a set of graphs, in temporal registration with each other, useful in explaining the operation of the system of FIG. 1.

In operation, and with reference also to the graphs of FIG. 4, system 20 provides for the forming of beam 30 by the radiators 26 of the antenna 22, and for orienting the beam 30 in a desired direction relative to a runway. Selection of the proper values of phase shift to form and to direct beam 30 is accomplished by the addressing of the ROM 48 by the address generator 50. The presetting and clocking of counter 76 is accomplished by reset generator 52 during a step known as "calibration load." During calibration load, each counter 76 is preset to address a specific value of phase shift from the assembly 78 of phase shifters 80 to start the respective calibration beat-frequency signal. The time reference signal on lead 74 is applied by the CPU for starting clock 86 in the signal processor 66. Command signals on the leads 44, during the calibration mode, are provided by action of the address generator 68 and the ROM 48.

As portrayed in the first graph of FIG. 4, the phase shift applied by the phase shifter 80 is implemented as a stepwise approximation to a continuously linear increase in phase. Since the phase shift is applied modulo 360°, the graph takes the form of a sawtooth waveform. The slope of the foregoing linear phase approximations with respect to time is equal to the beat frequency. The step increments are at a substantially higher frequency than the beat-frequency, the higher frequency of the steps being blocked by the filter 64 so that a smooth waveform appears on lead 72. The second graph of FIG. 4 portrays the reference signal outputted by the manifold 56, and the offset test signal resulting from the serrodyning of the signal of a selected channel 24. The waveform of the reference frequency signal is portrayed by a solid trace, and the waveform of the offset frequency test signal is portrayed by a dashed trace. The frequency difference between the two traces is exaggerated so as to more readily portray the frequency shift due to the serrodyning. It should be noted that the output sample of the channel 24 being calibrated (the dashed trace) is in time synchronization with the sawtooth waveform of the first graph of FIG. 4. In the bottom graph of FIG. 4, the difference in frequency between the two signals of the second graph is portrayed. The signal in the bottom graph is the relatively low beat-frequency signal. A particular feature in the generation of the beat-frequency signal by means of the sawtooth phase increment, and in the measurement of phase and delay by use of a timing reference on lead 74, is the use of a common clock, namely, clock 70 to insure phase lock between generation of the beat-frequency signal and measurement of time delay and phase shift thereof. Thus, the counting by counter 88 in the signal processor 66 provides for an accurate measure of the insertion phase of each channel 24 during the calibration process.

The operation of the invention is explained further with reference to FIGS. 5–8. A feature of the invention is the generation of a reference signal by combining signals of all of the channels 24, except for the channel being calibrated. All of the channel signals originate from the same source, namely, transmitter 32 and, therefore, have the same frequency except for the channel being calibrated, wherein the signal frequency is offset by the serrodyning. The signals of equal frequency sum together within the manifold 56 to produce a single sinusoidal signal, the reference signal, with a phase angle dependent on the phase angles and amplitudes of the individual channel signals. This summation of channel signals is portrayed readily by representing each signal by a vector, and by summing the vectors to produce a resultant vector which represents the reference signal.

The signal outputted by the manifold 56 is composed, as noted above, of two components, namely, the reference signal at the reference frequency and the serrodyned signal of the channel being calibrated. The serrodyned signal is offset in frequency from the reference frequency. Upon application of the two component signals from manifold 56 to the nonlinear circuitry of the mixer 62, there results both sum and difference frequency components. Filter 64 extracts the difference, or beat, frequency component from the mixer output. As shown by the mathematical expression in FIG. 5, the beat-frequency signal has a phase angle which is the difference between the phase of the serrodyned signal and the phase of the reference signal, there being yet a further component of phase shift to the beat-frequency signal resulting from delay in the signal-response time of filter 64.

Figure 5:
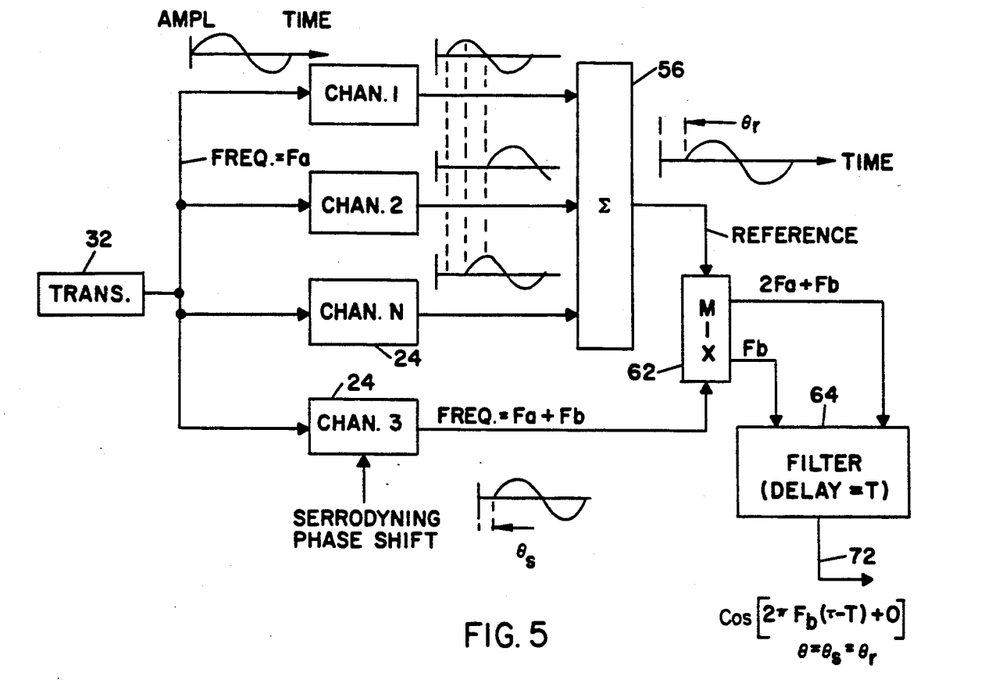
FIG. 5 shows schematically the combining of signals of various channels of FIG. 1 in producing a reference signal, a serrodyned signal offset in frequency from the reference signal, and the mixing of the two signals to obtain a beat-frequency signal.

In FIG. 5, graphs showing signal waveforms are appended alongside the leads having the channel signals. The output of transmitter 32 is represented as having zero phase shift. This system is shown as having N channels, wherein the third channel receives a serrodyning phase shift for calibration of the third channel. Output signals of each of these channels are depicted as a sinusoidal waveform with an initial zero crossing which has been delayed, the amount of the delay differing in each of the channels. Such delay is the insertion delay and may include a component of delay which is variable due to thermal expansion of the microwave components of which the antenna system is fabricated. It is assumed, for purposes of system stability, that the major contributor to system delay is the delay T in the response time of filter 64, and that other contributors to the system delay are negligibly small, and need not be considered in this evaluation. Phase shift introduced by system components, not including the filter delay, are represented by $\phi$, with the legends r and s identifying, respectively, the phase of the reference signal and the phase of the serrodyned signal. The frequency outputted by transmitter 32 and present in the reference signal is represented by $F_a$. The frequency offset due to the serrodyning of the third channel is represented by $F_b$, this offset frequency also being the magnitude of the difference or beat frequency outputted by mixer 62 as shown in FIG. 5. The presence of the offset frequency $F_b$ enables a signal channel to be tested to determine the amount of phase shift therein, relative to the reference signal, so as to allow for the selection of a compensating fixed value of phase shift to be applied to the channel, thereby to calibrate the channel.

Figure 6:
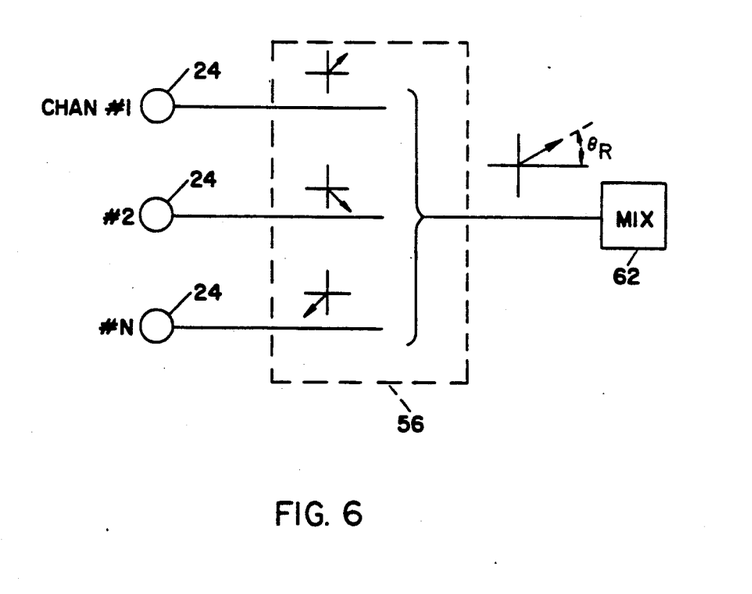
FIG. 6 shows a vector construction of signals useful in explaining operation of the manifold of FIG. 1 which is used as a summer for combining channel signals to produce the reference signal.

The use of manifold 56 as a summing element for summing together a set of channel signals is demonstrated further in FIG. 6, wherein the signals outputted by the channels are each represented by a vector. Summation of the vectors produces the vector of the resultant signal, namely, the reference signal, which is applied to mixer 62.

After selecting the channel to be calibrated, the CPU directs the application of the serrodyne phase shift pattern (first graph of FIG. 4) to the phase shifter of the selected channel. Since the serrodyne frequency offset is very much smaller than the C-band signal of the transmitter 32, the beat-frequency signal appears almost instantaneously, and has the waveform depicted in FIG. 7 at the input of filter 64. To suppress filter transient effects, signal processor 66 is delayed by two cycles of the beat signal to allow the response of filter 62 to settle down to a uniform output of the beat signal. Thereafter, delay is measured to the first positive-going zero-crossing of the beat signal, which is equal to the actual zero-crossing time $T_o$ plus the filter delay T. Thus, the total measurement interval $T_m$, depicted in FIG. 7, is the sum of the settling time, plus the zero-crossing time, plus the filter delay.

Figure 7:
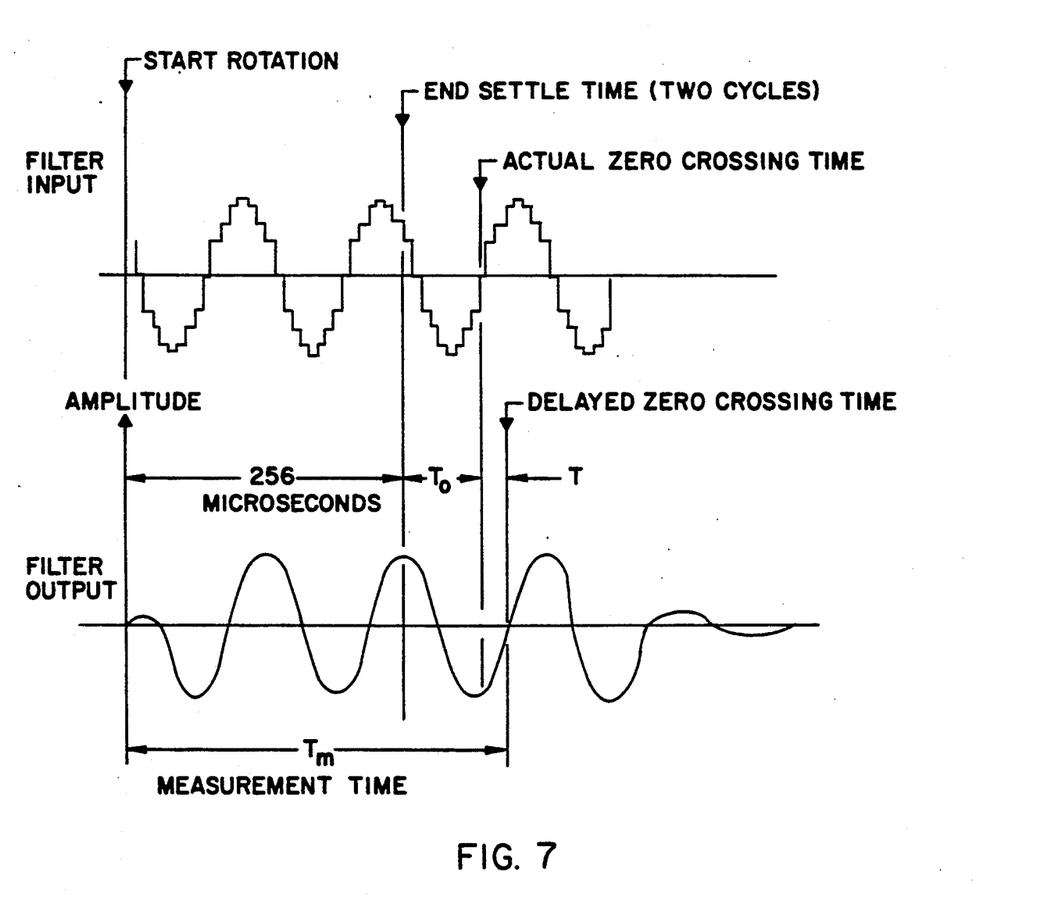
FIG. 7 is a graph showing measurement times for measurements formed by the signal processor of FIG. 3.

As described previously with reference to FIG. 3, operation of clock 86 starts upon initiation of the serrodyne phase pattern (signal on lead 74 in top graph of FIG. 4), and stops upon the occurrence of the positive-going zero-crossing of the beat signal on lead 72, as depicted in FIG. 7. The compensatory phase shift $\theta$ to be applied to the phase shifter of the serrodyned channel, which ensures that this channel and the reference signal are in phase at the initiation of the serrodyn process, is given by:

$$\theta = \frac{360}{128} (T_m - T - 352) \text{ degrees}$$

$T_m$ and T are measured in microseconds.

Figure 8A:
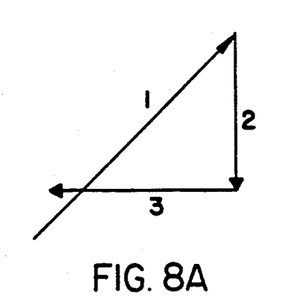
Figure 8B:
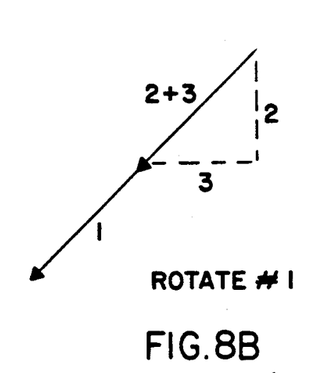

FIGS. 8A–8D show a dependency of the vector of the reference signal upon subsequent calibrations of the channels from which the signals are summed to produce the reference signal. FIG. 8A is drawn to illustrate a simple example of a system employing only three of the channels 24. FIG. 8A shows three vectors, identified by the numerals 1, 2, and 3, each of these vectors representing signals in corresponding ones of three channels prior to calibration of any one of the channels. In the example of FIGS. 8A–8D, channel #1 is to be calibrated first, followed by channel #2, and then channel #3. Accordingly, the signal of channel #1 is serrodyned resulting in an offsetting of the channel #1 so that only the signals of channels #2 and #3 are summed to form the reference signal. The resultant reference signal is equal to the vectorial sum of the vectors 2 and 3, as depicted in FIG. 8B. By activating signal processor 66 (FIGS. 1 and 3), a time delay measurement is outputted by counter 88 to the CPU, which then directs a compensatory phase shift to be applied to the phase shifter of the first channel. The compensatory phase shift is applied by the preset generator 52 (FIG. 1) to the phase shift circuit 38 in the first channel. Introducing the compensatory phase shift results in a rotation of vector 1, as depicted in FIG. 8B, to place vector 1 in substantial alignment with the reference signal vector. The alignment is approximate, because of the quantization of compensatory phase shift by the digital phase shifting of the phase shifters 80 (FIG. 2).

Figure 8C:
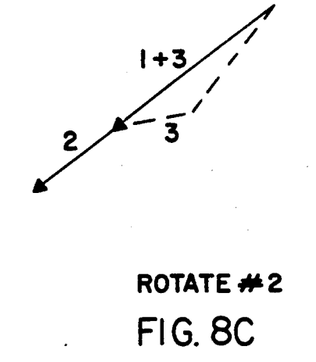

The calibration procedure proceeds at FIG. 8C by the generation of a new reference vector, and by rotation of the vector of the channel 2 signal into alignment with the new reference vector. The new reference vector is a combination of vector 1 and vector 3. However, vector 1 has already been rotated from its original orientation, as described in connection with FIG. 8B. Therefore, the new reference vector is equal to the sum of original vector 3 plus rotated vector 1. Upon operation of signal processor 66 to measure the delay in the beat signal of the second channel and upon activation of the preset generator 52, vector 2 is aligned approximately to the new reference signal vector as depicted in FIG. 8C.

Figure 8D:
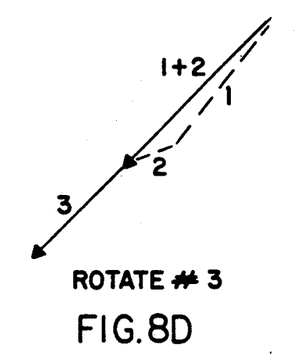

The calibration procedure continues, in FIG. 8D, with a testing of the third channel signal relative to a further value of the reference signal vector. Here, the reference signal vector is a combination of rotated vector 2 and rotated vector 1. Upon activation of signal processor 66 to determine the time of occurence of the positive-going zero-crossing of the beat signal for channel #2, and upon activation of the reset generator 52 to provide the compensatory phase shift, the vector 3 is placed in substantial alignment with the reference vector provided by summation of rotated vector 2 with rotated vector 1.

It should be noted that with each calibration of a signal channel, a different value of reference signal has been employed. It is also clear that upon examination of the vector diagrams of FIGS. 8A and 8D, all of the vectors are much more closely aligned in FIG. 8D than in FIG. 8A as a result of the calibration process. However, it has been observed in actual operation of the invention it is possible for a subsequent calibration run, in which each of the channels is calibrated, to provide a set of channel signal vectors which are not well aligned, thus manifesting system instability. Such instability results by virtue of quantization of the compensatory phase shift, and by failure to introduce the proper value of filter delay T (see mathematical expression in FIG. 5) in generating the compensatory phase shift. One solution to this instability would be to measure the time delay of filter 64, so that the resultant phase shift associated with the filter time delay can be eliminated, in which case the compensatory phase shift is given directly by $\theta$. An alternative procedure, which is employed in the preferred embodiment of the invention, is to repeat a calibration run several times, with each run being performed with a different presumed value of the true filter delay T.

Figure 9:
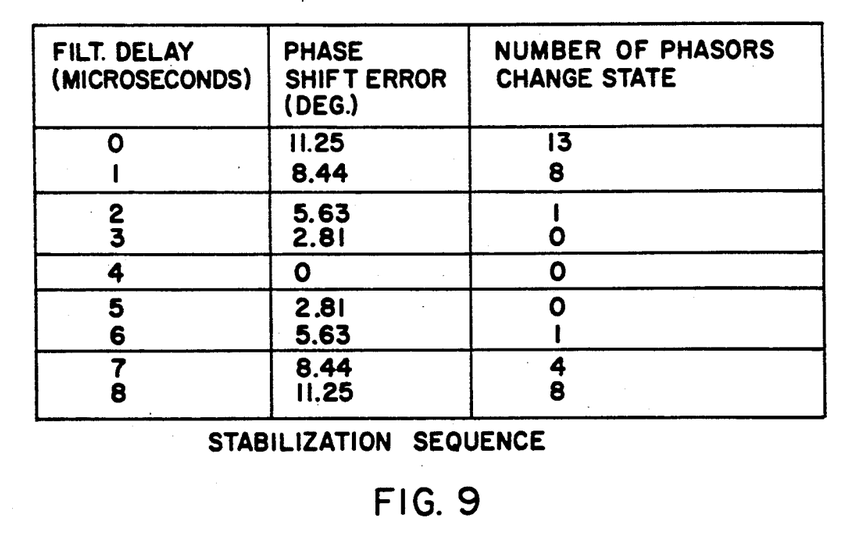
FIG. 9 shows tabulated results of a stabilization sequence of ten calibration runs centered about a presumed filter delay, employed in FIG. 1, the delay having a value of 4 microseconds (12° phase delay) in the case of a phased array antenna of 16 channels.

FIG. 9 shows the results of a sequence of calibration runs performed for the purpose of identifying the appropriate value of filter delay, thereby to stabilize the system of the invention. For example, assuming that the value of filter delay is known to be approximately 4 microseconds, then a sequence of calibration runs is provided wherein the first run employs a value of presumed time delay of 0 microseconds, and the final calibration run employs a value of presumed time delay of 8 microseconds. The table of FIG. 9 has been generated for a system employing sixteen channels. In an unstable system, wherein the values of compensatory phase shift fail to converge to the proper values of phase shift, nearly every channel requires a change of phase shift with each calibration run. This can be seen from the first row in FIG. 9 wherein 13 out of 16 phases changed state. For the case where the beat-frequency signal has a period of 128 microseconds, a measurement error of one microsecond corresponds to a phase shift error of 2.81°. The phase shift error is noted in the middle column of FIG. 9. Upon attempting to correct the inaccuracy of the time delay, by reducing the presumed time delay to 1 microsecond as shown in the second row of FIG. 9, the phase error is only −8.44°, and the number of phasors changing state is reduced to 8 phasors. By further correcting the time delay, by further reduction in the presumed value of the time delay, a phase shift error of 0° is attained at the 4 microsecond delay. Further reduction on the presumed value of time delay results in an over correction and the introduction of increasing values of phase shift error, and in an increasing number of phasors which change state. It is interesting to note that stable system operation is obtained with phase errors in the range of +3° to −3°, where no phasors change state from one calibration run to the next. Therefore, the system is stable for correct values of filter time delay, the stability being maintained even for small errors in the estimation of the filter time delay. It is also noted that there is a possibility, during a calibration run, that a set of vectors for the channel signals might produce a near-zero resultant vector wherein the reference signal is too small to implement the mixing process in mixer 62. However, this does not present a problem since the system need only advance to the next channel, in which case the value of the reference signal vector changes so as to provide the requisite reference signal.

Figure 10:
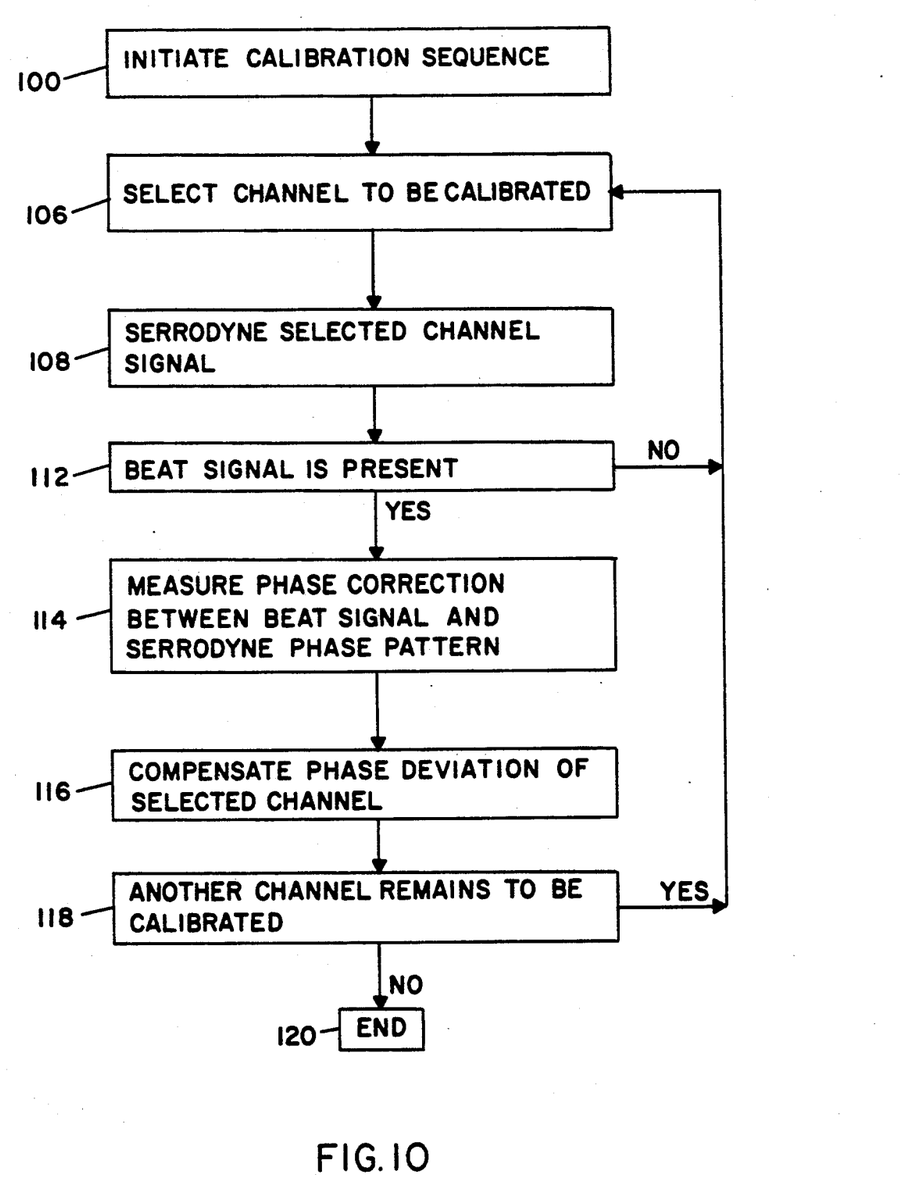
FIG. 10 is flow chart of a program for operation of the central processing unit (CPU) of FIG. 1 in conducting of a calibration sequence.

FIG. 10 is a flow chart of the steps in a program for operation of the CPU to initiate and carry forth a sequence of calibration steps to accomplish a calibration run. The calibration sequence is initiated at block 100. At block 106, one of the channels is selected to be calibrated. Thereupon, at block 108, the phase shifter (FIGS. 1 and 2) of the selected channel receives the serrodyned phase shift pattern (top graph of FIG. 4) to provide for a serrodyning of the signal of the selected channel.

Determination is made at block 112 as to whether the beat signal is actually present. As noted above, in the event that the reference signal is too small, there may not be sufficient mixing action to produce the beat signal. In the event that the beat signal is not present, then the operation reverts to block 102, with the selection of another signal channel at block 126. If the beat signal is present, then operation proceeds to block 114 with a measurement of phase deviation between the beat signal and the serrodyned phase pattern. Thereupon, at block 116, the compensatory phase shift is introduced by the reset generator 52 to the phase shifters 80 of the selected channel to compensate for the phase deviation between the beat signal of the selected channel and the serrodned phase pattern. At block 118, the CPU then determines whether all of the channels have been calibrated. If there are further channels to be calibrated, then the program reverts to block 106 for calibration of the next channel. In the event that there are no more channels to be calibrated, then the program ends at block 120.

Figure 11:
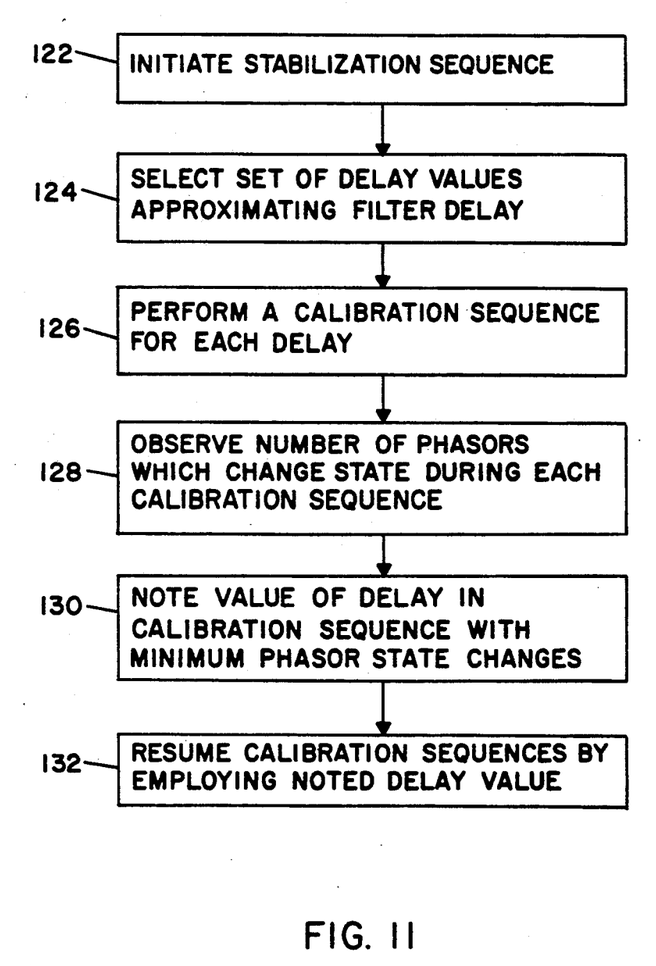
FIG. 11 is a flow chart of a program for the CPU of FIG. 1 for operation of a stabilization sequence of calibration runs.

In FIG. 11, the CPU performs a sequence of steps to provide for stabilization of the calibration run as shown in FIG. 10. In FIG. 11, the program begins with the initiation of a stabilization sequence at block 122, whereupon the CPU selects a set of delay values, block 124, for approximating the filter delay. This is in accordance with the exemplary values of delay set forth in the table of FIG. 9. The program steps proceed to block 126, where a sequence of calibrations is performed upon each of the channels in accordance with the program of FIG. 10, the sequence being repeated for each value of delay referred to in Block 124. Then, at block 128, observation is made as to the number of phasors which changed state during each of the calibration sequences performed in block 126. This is in accordance with the right-hand column in the table of FIG. 9.

At block 130, observation is made as to which of the calibration sequences has resulted in a minimum number of phasor state changes. The value of delay providing the minimum number of phasor state changes is noted. This corresponds to the middle row in the table of FIG. 9.

Thereupon, at block 132, subsequent calibration sequences employ the noted value of filter delay. The noted value of filter delay provides for stable operation of the system of the invention. By way of example, in using the invention in a microwave landing system, it may be desirable to recalibrate the signal channels at frequent intervals, so as to correct phase deviations associated with thermal expansion of microwave components due to heating by rays of the sun.

Thus, the invention provides for the implementation of a calibration process within a system having multiple signal-carrying channels with the use of a minimum amount of additional circuitry, and with a minimal amount increase in the complexity to the physical structure of the system.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A method for calibrating phase shifts in a system having multiple signal-carrying channels comprising steps of:

extracting from each channel a sample of a signal translated by the channel;

summing together the signal samples of the respective channels;

selecting a first channel to be calibrated, the first channel translating a first signal;

applying a phase-shift test pattern to the first signal by incrementing the phase of the first signal in a monotonically continuing pattern of phase variation at a predetermined rate, thereby offsetting the frequency of said first signal relative to the frequencies of the signals translated by the other channels, all of the translated signals of the other channels having the same frequency and the sum of the signals of the other channels serving as a reference signal;

mixing the first signal with the reference signal to obtain a beat-frequency signal;

measuring a phase deviation between said beat-frequency signal and said test pattern;

replacing said test pattern at said first signal with a fixed amount of calibration phase of value commensurate with said phase deviation; and repeating the foregoing steps with each of the signals translated by the other channels, thereby providing a calibration sequence in which each channel is calibrated once.

2. A method according to claim 1 wherein in said step of measuring, the phase deviation is measured by timing the occurrence of a zero-crossing in the beat-frequency signal relative to a preset delay from the beginning of the test pattern.

3. A method according to claim 2 further comprising a step of stabilizing said calibration sequence, the stabilizing step comprising iterating said calibration step;

altering a value of said delay in said measuring step during each iteration of said calibration sequence;

noting values of phase deviations at the respective channels during each cycle in said calibration sequence;

selecting a value of said delay which minimizes the values of said phase deviations.

4. A method according to claim 1 wherein in said replacing step, a value of calibration phase increment is quantized digitally.

5. A method according to claim 4 wherein a value of calibration phase increment may be zero or the least significant bit of a digitally generated phase shift.

6. A method according to claim 1 wherein said mixing step is accomplished by feeding said first signal and said reference signal to a nonlinear electric circuit, and filtering an output signal of said nonlinear circuit to obtain said beat-frequency signal, said nonlinear circuit acting to produce sum and difference frequency components in the output signal of said nonlinear circuit, said filtering serving to select the difference frequency component.

7. Apparatus for calibrating phase shifts in a system having multiple signal-carrying channels comprising:

means for extracting from each channel a sample of a signal translated by the channel;

means for summing together the signal samples of the respective channels;

means for applying a phase-shift test pattern to a signal translated in a first one of said channels for calibrating said channels, said test pattern providing for an incrementing of a phase of the first-channel signal at a predetermined rate, the incrementing of phase offsetting a frequency of the first-channel signal relative to frequencies of signals translated by other ones of said channels, the frequencies of the signals translated by said other ones of said channels being equal, the sum of the signals of the other channels serving as a reference signal;

means for mixing the first-channel signal with the reference signal to obtain a beat-frequency signal;

means for measuring a phase deviation between said beat-frequency signal and said test pattern;

means for activating said applying means to replace said phase-shift test pattern at said first-channel signal with a fixed amount of calibration phase of value commensurate with said phase deviation;

wherein said activating means causes said applying means to be operative in turn upon signals of other ones of said channels to provide for calibration of other ones of said channels in a calibration sequence in which each channel is calibrated once.

8. Apparatus according to claim 7 wherein said measuring means is operative to measure phase deviation by timing an occurrence of a zero crossing in the beat-frequency signal relative to a preset delay from a beginning of the test pattern.

9. Apparatus according to claim 8 wherein said activating means operates to stabilize said calibration sequence, said activating means activating said phase-shift applying means in a plurality of calibration sequences, each calibration sequence differing from a previous calibration sequence by an amount of delay employed in a measuring of the phase deviation, said activating means selecting amounts of calibration phase obtained with values of delay wherein a calibration sequence minimizes changes in said amount of calibration phase.

10. Apparatus according to claim 7 wherein said phase-shift applying means operates digitally with digitally quantized phase increments.

11. Apparatus according to claim 10 wherein a value of calibration phase increment may be zero or the least significant bit of a digitally generated phase shift.

12. Apparatus according to claim 7 wherein said mixing means includes a nonlinear circuit, said mixing means being operative to accomplish a feeding of said first-channel signal and said reference signal to said nonlinear circuit, said mixing means filtering an output signal of said nonlinear circuit to obtain said beat-frequency signal, said nonlinear circuit acting to produce sum and difference frequency components in an output signal of the nonlinear circuit, said filtering selecting the difference frequency component.

* * * * *